(12) United States Patent
Liu et al.

(10) Patent No.: US 11,594,532 B2
(45) Date of Patent: Feb. 28, 2023

(54) ON-CHIP HEATER TEMPERATURE CALIBRATION

(71) Applicant: TEXAS INSTRUMENTS INCORPORATED, Dallas, TX (US)

(72) Inventors: Chengxi Liu, Austin, TX (US); Roy Hastings, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 173 days.

(21) Appl. No.: 16/914,822

(22) Filed: Jun. 29, 2020

(65) Prior Publication Data

US 2021/0407992 A1    Dec. 30, 2021

(51) Int. Cl.
    *H01L 27/08*    (2006.01)
    *H01C 17/232*    (2006.01)
    *H01L 21/66*    (2006.01)

(52) U.S. Cl.
    CPC ....... *H01L 27/0802* (2013.01); *H01C 17/232* (2013.01); *H01L 22/00* (2013.01)

(58) Field of Classification Search
    CPC ... H01L 27/0802; H01L 22/00; H01L 23/345; H01L 28/20; H01C 17/232; H01C 13/02; H05B 1/0227
    See application file for complete search history.

(56) References Cited

U.S. PATENT DOCUMENTS

| | | | |
|---|---|---|---|
| 3,644,864 A * | 2/1972 | Hirsbrunner | H02H 5/042 374/E7.031 |
| 7,855,432 B2 | 12/2010 | Male | |
| 10,401,889 B2 * | 9/2019 | Huang | G05F 1/648 |
| 2003/0160171 A1 | 8/2003 | Parrish et al. | |
| 2006/0262827 A1 * | 11/2006 | Hsu | G01K 7/01 374/1 |
| 2012/0170352 A1 | 7/2012 | Le Neel et al. | |
| 2013/0099770 A1 | 4/2013 | Cheng | |
| 2015/0127288 A1 * | 5/2015 | Coursey | G01K 7/16 702/99 |
| 2016/0182044 A1 | 6/2016 | Addepalli et al. | |
| 2018/0196101 A1 | 7/2018 | Qu et al. | |

OTHER PUBLICATIONS

International Search Report dated Sep. 30, 2021, PCT Application No. PCT/US2021/039478, 2 pages.
Written Opinion dated Sep. 30, 2021, PCT Application No. PCT/US2021/039478, 4 pages.

* cited by examiner

*Primary Examiner* — Shouxiang Hu
(74) *Attorney, Agent, or Firm* — Ray A. King; Frank D. Cimino

(57) ABSTRACT

Systems, methods, and circuitries are provided for calibrating a heater used to heat an adjustable resistance network during a trimming procedure. In one example, a circuit is provided that includes an adjustable resistance network including first resistance segments; a heater element thermally coupled to the adjustable resistance network; a calibration resistor including second resistance segments thermally coupled to the first resistance segments; and interface circuitry coupled to the calibration resistor.

9 Claims, 8 Drawing Sheets

US 11,594,532 B2

ON-CHIP HEATER TEMPERATURE CALIBRATION

BACKGROUND

Integrated circuits (ICs), especially analog integrated circuits, rely on precise, temperature-stable voltage and/or current sources. Traditionally, very precise voltage sources can be produced, for example, by using bandgap or buried Zener circuitry. It is desirable to produce current sources that exhibit both process stability and temperature stability.

SUMMARY

In one example, a circuit is provided that includes an adjustable resistance network including first resistance segments; a heater element thermally coupled to the adjustable resistance network; a calibration resistor including second resistance segments thermally coupled to the first resistance segments; and an interface circuitry coupled to the calibration resistor.

In one example a system is provided that includes an adjustable resistance network, calibration resistor thermally coupled to the adjustable resistance network, interface circuitry coupled to the calibration resistor, and a heater thermally coupled to the adjustable resistance network. The system includes a processor coupled to the heater and to the interface circuit, the processor configured to: retrieve a calibration value from non-volatile memory; generate a power supply control signal to cause a power pulse to be applied to the heater; measure a resistance of the calibration resistor by way of the interface circuitry; and adjust the power supply control signal to change a voltage level or duration of the power pulse based on a comparison between the calibration value and a value based on the measured resistance.

In one example, a method is provided that includes using a processor to: instruct a power supply to provide a power pulse to a heater; measure a resistance of a calibration resistor thermally coupled to an adjustable resistance network; read a calibration value for the calibration resistor; and adjust the power pulse based on a comparison between the calibration value and a value based on the measured resistance.

BRIEF DESCRIPTION OF THE DRAWINGS

Some examples of circuits, apparatuses and/or methods will be described in the following by way of example only. In this context, reference will be made to the accompanying figures.

DETAILED DESCRIPTION

The drawings may not be drawn to scale.

Resistive components used in integrated circuit (IC) processing often have very large temperature coefficients of resistance (TCRs), (e.g., measured in the 1000s of ppm/° C.) and large process tolerances, (e.g., +/−30 percent). To compensate for these variations, IC devices that are called on to generate precisely controlled currents may include an adjustable resistance network that can be adjusted, on a per-IC basis, to provide a zero or near-zero temperature coefficient across a range of operating temperatures. The adjustable resistance network includes one or more resistors having a positive temperature coefficient (hereinafter RP) connected with one or more resistors having a negative temperature coefficient (hereinafter RN). As will be described in more detail below, the adjustable resistance network is adjusted or trimmed by selectively shorting, opening, or otherwise isolating one or more of the resistors to arrive at an adjustable resistance network that provides not only the desired resistance at one specific temperature, but also reduces the variation of this resistance across a range of operating temperatures.

Figure 1:
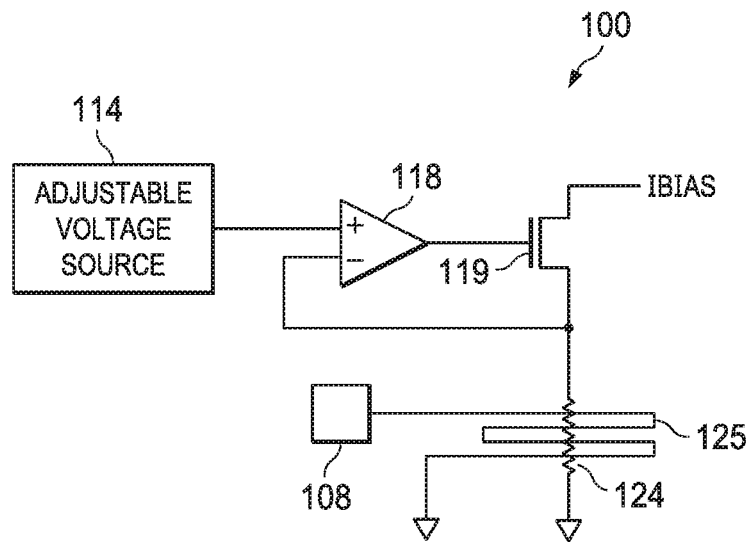
FIG. 1 is a block diagram of an example current source, according to one aspect of the description.

FIG. 1 illustrates a block diagram of an example current source circuitry 100 that provides a high-precision, on-chip, bias current IBIAS. Current source circuitry 100 includes a differential amplifier 118, a transistor 119, an adjustable resistance network 124, a heating element 125, an adjustable voltage source 114, and a bondpad 108. In operation, adjustable voltage source 114 provides a voltage with a temperature coefficient that is lower than the temperature coefficient of the adjustable resistance network 124 after the trimming operation. The voltage output by the adjustable voltage source 114 is input to differential amplifier 118 which adjusts the gate voltage of transistor 119 to urge the voltage across adjustable resistance network 124 toward the voltage generated by the adjustable voltage source 114. In this manner the voltage generated by the adjustable voltage source 114 does not significantly impact the output current of the current source circuitry. The current flowing through the adjustable resistance network 124 also flows from the drain of transistor 119 to the source of transistor 119. The current sunk into the drain of the transistor 119 becomes the current IBIAS generated by current source circuitry 100. Heater element 125 receives the voltage applied to bondpad 108 of the integrated circuit. Applying a voltage to bondpad 108 causes heater element 125 to heat adjustable resistance network 124. As will be described below, this heating technique allows measurement of temperature coefficients and, based upon this information, the adjustable resistance network 124 can be properly adjusted.

Figure 2:
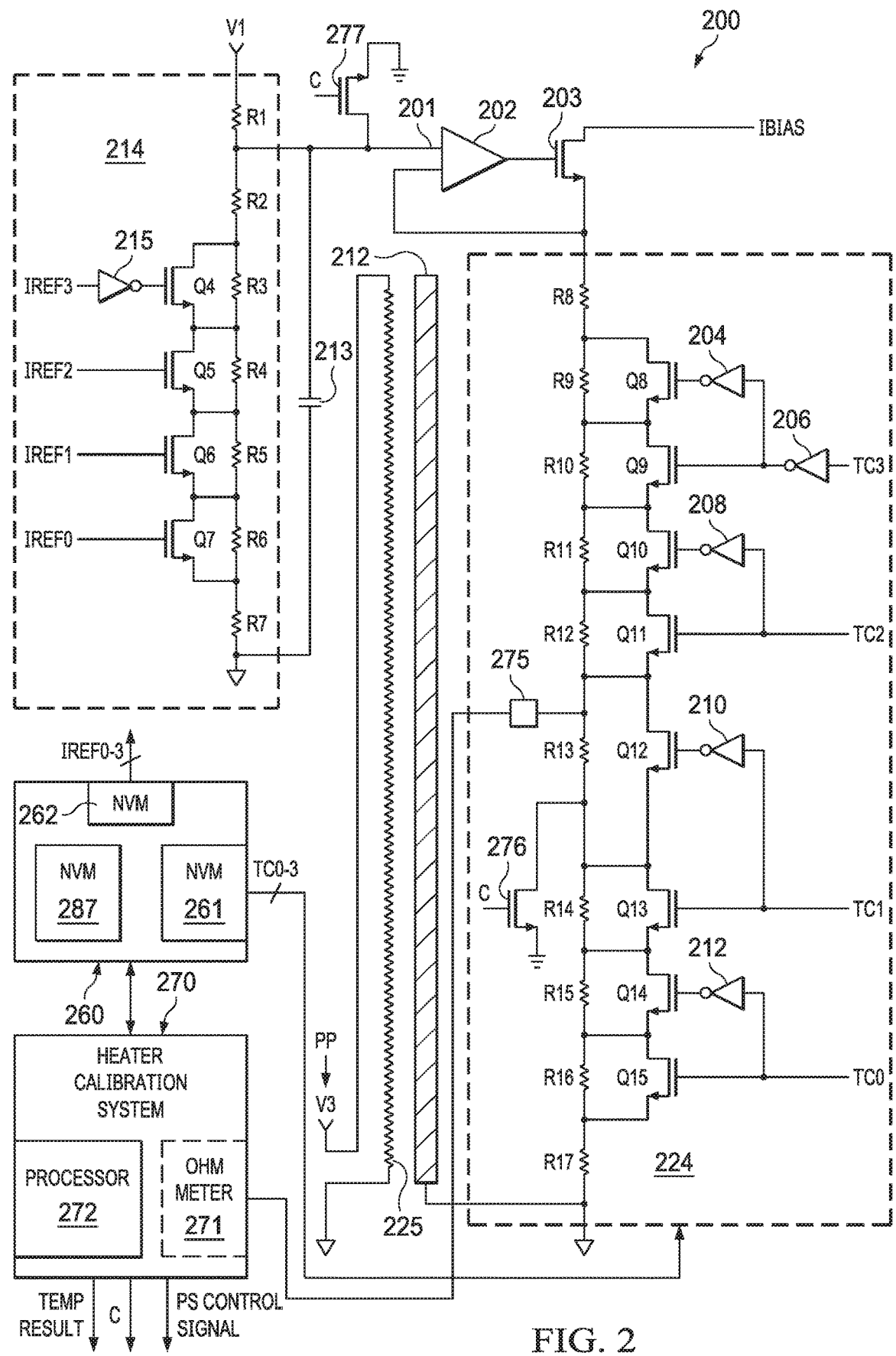
FIG. 2 is a block diagram of an example trimming system for the current source of FIG. 1, according to one aspect of the description, according to one aspect of the description.

FIG. 2 shows, in more detail, an example current source 200 that includes an adjustable resistance network 224. The current source 200 also includes an adjustable voltage source 214 (which is shown in greater detail), amplifier 202, NMOS transistor 203, and heater element 225. The adjustable voltage source 214 operates to provide a voltage indicated at node 201 to amplifier 202. By making voltage at node 201 adjustable rather than fixed, a means is provided to compensate for process variations in resistance of the adjustable resistance network used to generate the bias current. The adjustment of the adjustable voltage source 214 is made independently of the trim process that adjusts the temperature coefficient of the bias current. The voltage at node 201 is normally set after the temperature coefficient has been adjusted. The adjustable voltage source 214 includes reference resistors R1 through R7 coupled in series with one another between a fixed temperature-invariant reference voltage (indicated as V1) and ground. NMOS transistors Q4 through Q7 are coupled across resistors R3 through R6, respectively. Additionally, an inverter 215 is coupled to the gate of transistor Q4.

The voltage at node 201 is varied or adjusted based on the states of digital control signals IREF0 through IREF3. These control signals are generated by a digital nonvolatile memory (NVM) 262. The value programmed into NVM 262 will determine which of resistors R3-R6 are shorted and which are not. The resistances of R3-R6 are assumed to be binary weighted with R3 being the largest. Therefore IREF3 is the most significant bit of the digital control word IREF0-3. In other examples, the relative resistances of R3-R6 may have a different weighting. Inverter 215 is used so that the voltage at node 201 generated when the NVM 262 is not yet programmed (IREF0-3 are all low) will lie approximately in the middle of the range of voltages that can be produced by adjustable voltage source 214. This simplifies laboratory testing of the current source 200. A capacitor 213 connects to the output of the adjustable voltage source 214 to provide noise filtering.

The adjustable resistance network 224 provides the resistance needed to convert the voltage generated by adjustable voltage source 214 into a current. Amplifier 202 causes the voltage across the adjustable resistance network 224 to be within a predetermined equivalence range (based on the tolerance of the amplifier 202) of the voltage at node 201. The adjustable resistance network 224 includes resistors R8 through R17 and is thermally coupled to heater element 225 and an optional Faraday shield 212 (which may be grounded). While the resistors R8-R17 are described as being connected in series, in other examples the resistors are arranged in parallel or series-parallel. The adjustable resistance network is arranged into several trim sets coupled in series with one another. Each trim set includes a pair of trim resistors R9-R10, R11-R12, R13-R14, and R15-R16 coupled in series with one another. A pair of NMOS trim transistors Q8-Q9, Q10-Q11, Q12-Q13, and Q14-Q15 is associated with each pair of trim resistors, such that one NMOS transistor is coupled across one of the resistors R9 through R16. Inverters 204, 208, 210, and 212 each invert one of the TC0-3 inputs. Additionally, the gate of transistor Q9 and inverter 204 are coupled to inverter 206.

In operation, trim signals TC0 through TC3 are provided to the NMOS transistors Q8-Q15 by NVM 261 to control the temperature coefficient of the adjustable resistance network 224. Additionally, resistors R9, R11, R13, and R15 are made of a first material (e.g., a material having positive temperature coefficient RP), while resistors R10, R12, R14, and R16 are made of a second material (e.g., having a negative temperature coefficient RN). The resistors in a given pair (R9-R10, R11-R12, R13-R14, or R15-R16) are chosen to have the same nominal resistance at the temperature for testing (for example 25° C.). Accordingly, the total resistance of the string of resistors R8-R17 remains roughly the same regardless of the value of TC0-3. Process variation will introduce differences between these resistors, but the presence of adjustable voltage source 214 provides a means of trimming out this error after the temperature coefficient has been set by programming the NVM 261 controlling TC0-3.

The resistors controlled by TC0-3 are binary weighted, with resistors R9 and R10 being the largest. Thus the resistance of resistor R9 equals 2·the resistance of resistor R11 which equals 4·the resistance of resistor R13 which equals 8·the resistance of resistor R15. Also the resistance of resistor R10 equals 2·the resistance of resistor R12 which equals 4·the resistance of resistor R14 which equals 8·the resistance of resistor R16. The resistance of resistor R9 is approximately equal to the resistance of resistor R10, the resistance of resistor R11 is approximately equal to the resistance of resistor R12, the resistance of resistor R13 is approximately equal to the resistance of resistor R14, and the resistance of resistor R15 is approximately equal to the resistance of resistor R16.

An example of how one of the control signals, TC0, functions follows. If TC0 signal is low, resistor R16 is not shorted out by Q15, and resistor R16 adds a temperature coefficient term of a first polarity to the adjustable resistance network 224. If TC0 is high, then resistor R15 is not shorted out by Q14, and resistor R15 adds a temperature coefficient term of a second polarity to the adjustable resistance network 224. TC1 and TC2 behave similarly to TC0. If TC3 is low, resistor R9 adds a temperature coefficient term of the second polarity and if TC3 is high, resistor R10 adds a temperature coefficient term of the first polarity. The reversal of the polarity of TC3 with respect to the inputs TC0-2 that results from the insertion of inverter 206 causes the temperature coefficient of the series string of resistors R8-R17 to reside roughly in the middle of the possible range of values if the NVM 261 is un-programmed and TC0-3 are all low. This simplifies laboratory testing. Resistors R8 and R17 may either be made of the first material type (e.g., a material having positive temperature coefficient RP) or the second material type (e.g., having a negative temperature coefficient RN). The material type and sizing of resistors R8 and R17 relative to resistors R9-R16 are chosen so that for the nominal values of resistances and temperature coefficients, the total series resistance of string of resistors R8-R17 exhibits zero temperature coefficients.

Figure 3:
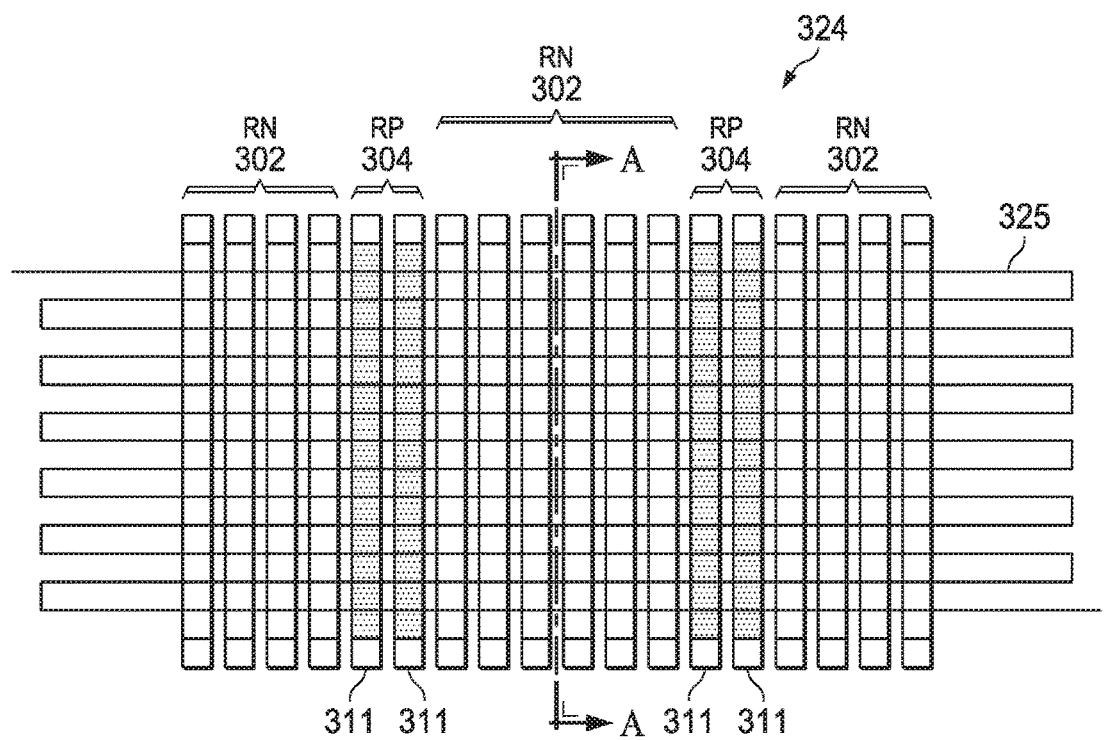
FIG. 3 is an example physical layout of an adjustable resistance network with a calibration resistor, according to one aspect of the description.
Figure 4:
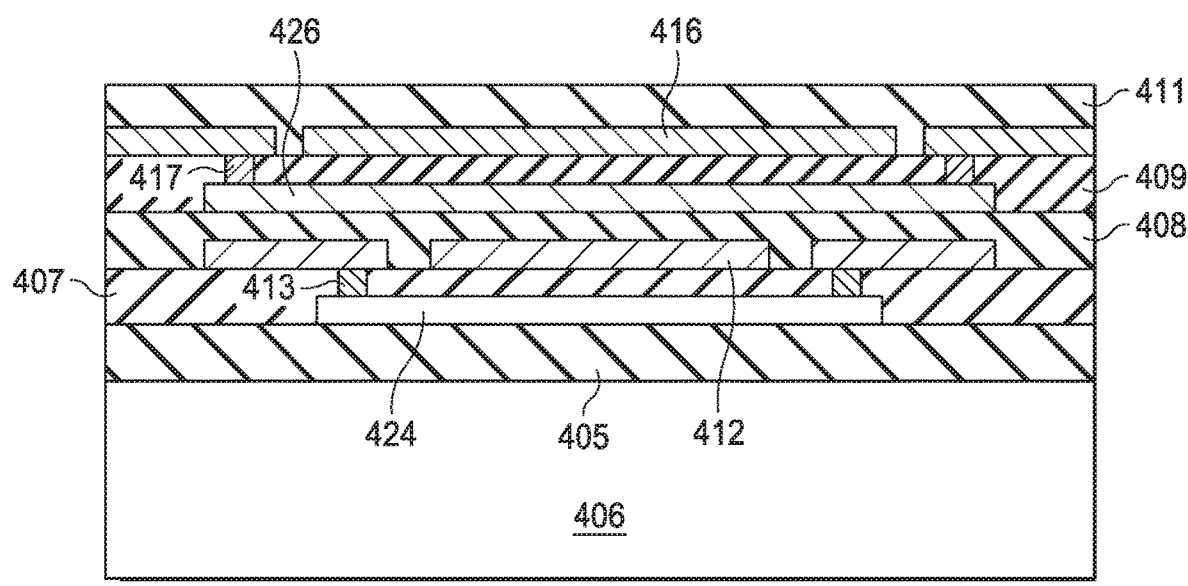
FIG. 4 is a cross section view of the adjustable resistance network of FIG. 3, according to one aspect of the description.

In addition to the particular resistance materials and nominal resistance values of the adjustable resistance network, the physical layout of the resistors in the adjustable resistance network on the integrated circuit is relevant to achieving a zero or low temperature coefficient without introducing undesirable thermal sensitivities. FIG. 3 illustrates a top view of an example layout of an adjustable resistance network 324, and FIG. 4 shows a cross-section through the integrated circuit along section line A-A in FIG. 3. Examining the cross-section of FIG. 4, the resistors reside above a semiconductor wafer 406. An insulative layer 405 of deposited or grown insulative material such as silicon dioxide is formed atop the semiconductor wafer 406 during fabrication. A layer of a resistive thin-film material 424, such as doped polysilicon, is deposited and patterned atop insulative layer 405 to create an array of physical resistance segments fabricated from a resistive material of approximately constant thickness. Member of the array of physical resistance segments formed by the resistive thin-film material will function as the calibration resistance segments 311 and the adjustable resistance network 324.

There are several ways to form the array of physical resistance segments. In one example, the resistive thin-film material is deposited, photoresist is spun on, openings are patterned in the photoresist, material in the openings is etched off, and then the photoresist is removed. In another example, a molecular or ion beam is scanned to selectively (if slowly) deposit resistive materials. In another example, a resistive material is selectively deposited through a shadow mask. In yet another example, photoresist is spun on, holes are opened in the photoresist where resistive material is desired, the resistive material is deposited across the whole area, and the a process to lift-off the photoresist carries away the resistive material that was not in holes of the patterned array.

While the calibration resistor's segments 311 are illustrated in FIGS. 3-4 as being in the same layer as the other segments in the adjustable resistance network, other arrangements are possible. For example, the calibration resistor's segments and the adjustable resistance network's segments may be disposed amongst three adjacent or proximate layers of the IC. Adjacent or proximate layers means that the layers exhibit similar average temperature during the trim process. The calibration resistor's segments may be disposed in a first and third layer while the adjustable resistance network's segments are disposed in a second layer. As long as the average temperatures of the first layer and third layer are similar to the temperature of the second layer, the calibration resistor provides a good proxy representative of the temperature of the adjustable resistance network.

A second layer of insulative material 407 (such as silicon dioxide) is deposited atop resistive thin-film material 424 and planarized. Openings are then etched through the second layer of insulative material 407, forming contacts 413 to the resistive thin-film material. These contacts 413 may either be deposited along with a first layer of metallization 412, or they may be deposited and polished back to the surface of the second layer of insulative material 407 in a second step, in which case the contacts 413 may be made from a different conductive material (such as tungsten).

The first layer of metallization 412, such as aluminum or an aluminum alloy, is then formed by evaporation or sputtering followed by patterning and etching. A third insulative layer 408 (such as silicon dioxide) is deposited atop the first layer of metallization 412 and is subsequently planarized. Vias may be formed through the third insulative layer although none are shown in FIG. 4. Next a second layer of metallization 425, for example aluminum or an aluminum alloy, is deposited and patterned. A fourth insulative layer 409 (such as silicon dioxide) is deposited atop the second layer of metallization and is subsequently planarized. Vias 417 are patterned and etched through the fourth insulative layer 409. The conductive material filling these vias may either be third metal 416 or a separate conductive material (such as tungsten) deposited and polished back to the surface of fourth insulative layer 409.

A third metallization layer 416, for example aluminum or an aluminum alloy, is then deposited and patterned. Finally, a fifth insulative layer 411 is deposited over the third metallization layer 416. This step completes fabrication of the semiconductor wafer 406. The above description assumes the use of aluminum or aluminum alloy metallization, but fabrication techniques based upon single or double damascene processing can be used to fabricate copper or copper alloy metallization without substantially altering the final cross-section illustrated in FIG. 4.

FIG. 3 illustrates a top view of a layout of the example adjustable resistance network 324 and a serpentine metal line 325 that forms resistive elements of the heater. The adjustable resistance network 324 includes a plurality of resistance segments (hereinafter "segments") 302, 304. Segments 302 are made of first resistance material, and segments 304 are made of second resistance material. In a practical implementation of the resistance network, there may be many more segments of each type than are shown in this simplified illustration. In this example, the first resistance material possesses a small negative temperature coefficient and the second resistance material possesses a larger positive temperature coefficient. However, in other examples, the first resistance material possesses a large negative temperature coefficient and the second resistance material possesses a smaller positive temperature coefficient. In any given process, the relative magnitudes of the two temperature coefficients will depend upon the composition of the two resistance materials. In other words, the positive temperature coefficient material might have a temperature coefficient whose magnitude is smaller, equal, or larger than the absolute value of the temperature coefficient of the negative temperature coefficient material. The relative number of segments 302, 304 is selected to enable the achievement of an overall zero, or nearly zero, temperature coefficient after trim.

In the cross-section of FIG. 4, the serpentine metal resistor used as a heater is constructed on the second layer of metallization 426. The metal plate on the third metallization layer 416 (shown in FIG. 4 but not FIG. 3) helps improve lateral heat conductivity, thus serving as a heat spreader. Heat spreaders improve the lateral thermal conductivity across the array of resistance segments because metal possesses a much higher thermal conductivity than most insulative materials used in integrated circuits, such as silicon dioxide. The heat spreaders are of significant value because the vertical dimensions of the array of resistance segments are much smaller than its lateral dimensions, and therefore even though the insulative materials are poor conductors of heat, a large vertical heat flow to the substrate still occurs. One or more of the heat spreaders may also be connected to ground or another low-impedance circuit node to reduce capacitive coupling between the resistors and other circuit components, such as the heater. Such a capacitive shielding structure is sometimes called a Faraday shield. The Faraday shield constructed on first layer of metallization 412 also doubles as a heat spreader in its own right. In processes with only one metallization layer, the Faraday shield and heat spreader may be omitted and the heater constructed on the first and only metallization layer. Processes with multiple metallization layers allow a choice of metal layer with which to construct the heater, and also permit the inclusion of a Faraday shield to reduce noise coupling between the segments and the heater, and one or more heat spreader layers.

The example of FIG. 3 and FIG. 4 assumes that both resistance materials are doped polysilicon; alternatively, one or both resistance materials may include alternative thin film materials deposited below the first metallization layer, between metallization layers, or above the topmost metallization layer. Although polysilicon resistors may have poor TCRs and poor absolute thickness tolerances, the doping levels of polysilicon resistors can be structured and arranged to produce materials having either negative or positive temperature coefficients. In an additional example, polysilicon is selectively silicided to reduce MOS gate resistance and improve contact resistance, as silicided polysilicon exhibits a large positive temperature coefficient. Polysilicon resistors vary approximately linearly with temperature and silicides vary approximately linearly with temperature.

As an example, one of the resistance materials in the adjustable resistance network 324 (e.g., the first resistance material which makes up segments 302) is a high-sheet resistance (HSR) polysilicon resistor and the other resistance material in the adjustable resistance network 324 (e.g., the second resistance material which makes up segments 304) is a low-sheet resistance (LSR) polysilicon resistor. LSR polysilicon resistance segments 304 and HSR polysilicon resistor resistance segments 302 have identical or substantially identical thermal properties, such as thickness, density, specific heat, and thermal conductivity, but have positive TCRs and negative TCRs, respectively. For example, when an illustrative LSR polysilicon resistance segment 304 is heated, its resistance increases uniformly or linearly at about +800 ppm/° C. In contrast, when an HSR polysilicon resistance segment 302 is heated, resistance decreases uniformly or linearly at about −400 ppm/° C. In the trimming process the combination of positive TCR, LSR polysilicon resistance segment 304 and negative TCR, HSR polysilicon resistance segments 302 in the adjustable resistance network 324 are adjusted to provide a zero or near-zero overall network temperature coefficient of resistance. Moreover, the resistance segments 302 and the resistance segments 304 can also be advantageously structured and arranged to reduce the impact of external thermal gradient effects, such as, for example, by using a common-centroid layout.

The trimming process begins with a measurement of the combined resistance of the resistance network at the temperature of the testing facility, hereinafter called "room temperature." This temperature may either be measured by an instrument external to the integrated circuit, or air conditioning may be relied upon to maintain a nominal temperature of, for example, 25° C. Next, a power supply is controlled to provide a predetermined power pulse of a predetermined voltage level is applied to the heater for a predetermined period of time, the voltage and time being chosen so the temperature of the resistance network will be raised to a desired value. A second measurement of resistance is then made. The proper time and temperature can be determined by laboratory measurement of sample devices in a suitable heating chamber or system. Subsequent comparison of the resistance at temperature of the same samples after activation of the heater at various voltages and for various time durations is used to select a heater voltage and time duration that should yield the desired temperature. However, the performance of the samples used for characterization may not exactly match that of the actual production units, a factor which will be addressed by the circuitries, systems, and methods described herein.

Disposing the resistive heater element in the second layer of metallization 425 directly above (or directly below) the layer of resistive thin-film material 424 that forms the adjustable resistance network promotes better thermal coupling while confining the heating element to a small percentage of the overall circuit area so that just the adjustable resistance network is heated. Very tight thermal coupling reduces the thermal gradient across both the negative TCR portion (including segments 302) and the positive TCR portion (including segments 304) of the adjustable resistance network. Thermal coupling also allows fast, first-order thermal response time constants in the range between about 20 to about 50 microseconds (μs). As a result, the settling time is less than about 100 μs, which does not significantly impact testing and trimming time. In one example, once the resistive heater element in second layer of metallization 425 is energized, the local temperature of the adjustable resistance network in the layer of resistive thin-film material 424 is between about 30-60° C. above the average temperature of the bulk silicon substrate or die. The average temperature of the bulk silicon substrate or die remains relatively unchanged throughout the energizing phase while the adjustable resistance network 120 is heated.

Alternatively, the resistive heater element can be energized quickly, e.g., using a voltage jump from 0 V to second voltage, in one example about 48 V, producing a thermal pulse. Energizing the resistive heater element provides an abrupt change in temperature (ΔT) of the resistance segments 302 and 304 in the adjustable resistance network 324 of, for example, about 40° C. The temperature may be set by the pulse voltage level. Thus, the ΔT may have more influence on the trimming process than the absolute temperature because the intent is to provide a repeatable temperature look ahead signal from which the combination of first and second resistance segments 302 and 304 can be adjusted to achieve a zero or near-zero TCR.

Returning to FIG. 2, a trim controller 260 (e.g., a processor, a four-bit controller such as a current splitter, a current minor, and the like) interfaces with the adjustable resistance network 224 at lines TC0-3, and with adjustable voltage source 214 at lines IREF0-3. Although four lines TC0-3 and four lines IREF0-3 are illustrated, the number of lines for the TC and IREF control signals may be different and a number other than four may be chosen depending upon the desired trim resolution. On each of the lines IREF0-3 and TC0-3, the trim controller 260 places a constant voltage representing either a logic high or one or a logic low or zero. The values IREF0-3 can thus be represented as one digital word, and the values TC0-3 can be represented as a second digital word. Trim controller 260 may be entirely integrated on the IC, or only a portion of the controller may be integrated and the remainder implemented in external test hardware. In either case, the trim controller computes the values to place on TC0-3 to provide the lowest possible TCR and stores the computed values in a nonvolatile memory (NVM) 261 that constitutes a portion of trim controller 260 placed on the integrated circuit. Furthermore, the trim controller 260 computes the values to place on IREF0-3 to set the total resistance as close to the desired value as possible, and stores these in a NVM 262 that constitutes a portion of trim controller 260 placed on the integrated circuit. Upon subsequent application of power, the integrated portion of the trim controller can retrieve these values from NVM 261 and NVM 262 and apply them to IREF0-3 and TC0-3 so that the adjustable resistance network is trimmed to the proper value and minimal temperature coefficient. In other examples, the values for IFEF0-3 and TC0-3 can be stored in the same NVM. In other examples, the NVM 261 and/or NVM 262 may not be part of trim controller 260 but are elsewhere on the integrated circuit.

In a simple trim algorithm, the trim controller 260 applies default values of TC0-3 which would reduce temperature variation if both the resistivities and the temperature coefficients of the two resistance materials were equal to predetermined nominal values. The trim controller then measures the resistance of adjustable resistance network 224 before and after the heater element 225 is energized. Using these data and the process minimal values of resistivity and temperature coefficients, the trim controller can change the overall TCR of the adjustable resistance network 224 by changing the value of the digital word represented by TC0-3, thereby altering the number of the first resistance material segments 302 and the number of second resistance material segments 304 that make up the adjustable resistance network 224.

The voltage level and duration of the predetermined power pulse applied to the heater element 225 are two factors that control the amount of heating that occurs in the adjustable resistance network 224 during the trimming process. The voltage level and duration of the power pulse are determined during initial characterization of the IC device, as discussed above. However, the packaging of the IC may also affect the amount of heating of the adjustable resistance network. For example, different packages include a substrate that is background to different thicknesses, thus varying the substrate's thermal capacity. In another example, the mold compound used to encapsulate a plastic-packaged integrated circuit may be changed. In a third example, the device might be placed in a different type of package, such as a hermetically sealed metal can or a chip-scale package with only minimal thickness of insulative film applied to the surface of the integrated circuit. Therefore, if the IC is installed in a different packaging arrangement than the one used for the initial testing or some other test parameter changes, simply applying the same voltage pulse may not result in the same change in temperature of the adjustable resistance network.

In particular, consider the case where the temperature-sensitive components are polysilicon (poly) resistors. Polysilicon varies only approximately linearly with temperature, and therefore a more accurate model of its behavior would include both a linear temperature coefficient and a quadratic temperature coefficient computed by quadratic least-squares regression from measured data, rather than a single (linear) temperature coefficient computed by linear least-squares regression. The following applies to the case where the poly resistors are characterized by both linear and quadratic temperature coefficients. It is assumed that a process can fabricate poly resistors with both positive and negative linear temperature coefficients (RP and RN, respectively). By choosing the values of RP and RN appropriately and connecting them in series, parallel, or series-parallel networks, approximately zero linear temperature coefficient for the overall adjustable resistance network. The temperature coefficient of the network will vary with process as the values and temperature coefficients of RP and RN both exhibit process variation. Also, the quadratic temperature coefficients of RP and RN will almost certainly not cancel one another.

An on-chip heater can be used to measure the residual temperature coefficient and to adjust the values of RP and RN in the adjustable resistance network to reduce the overall variation caused by the residual linear coefficients and quadratic coefficients of the combined adjustable resistance network. This represents a significant improvement upon the simplest possible trim algorithm, which assumes process nominal values of sheet resistances and temperature coefficients in order to extrapolate the trim code based upon measurements at room temperature and elevated temperature. In order to obtain information to reduce the residual quadratic component of the temperature coefficient of the adjustable resistance network, it is desirable that a known and repeatable temperature rise occur when the heater is engaged, regardless of the nature of the IC's packaging. This can be achieved, at least approximately, by using selected resistance segments that have either only a positive temperature coefficient or a negative temperature coefficient as a temperature-variable calibration resistor. In one example, the calibration resistor is electrically coupled to the adjustable resistance network. In other examples, the calibration resistor is not electrically coupled to the adjustable resistance network but is thermally coupled to the adjustable resistance network. It is advantageous to select, as the calibration resistor, resistance segments made of the material having the larger temperature coefficients and the lower process variability in temperature coefficients. By measuring the resistance value of the calibration resistor at both at room temperature and at the elevated temperature that results from activation of the heater, an estimate of the elevated temperature can be obtained.

Figure 5:
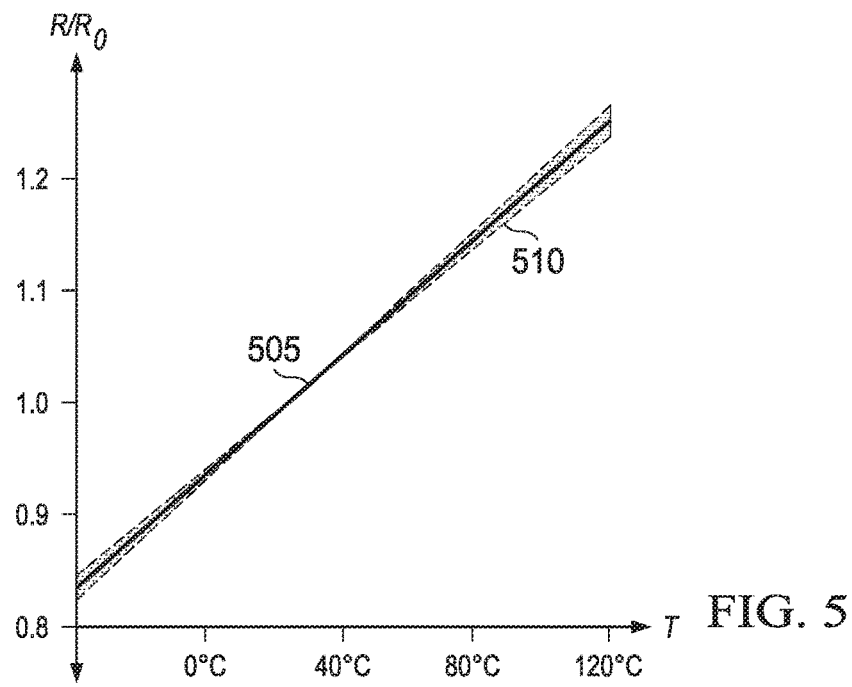
FIG. 5 is a plot of resistance versus temperature of an example silicided polysilicon resistor.

FIG. 5 illustrates the resistance value of a certain silicided poly resistor as a function of temperature. Silicides are stoichiometric compounds of silicon and certain other elements, for example, titanium, cobalt, and nickel. Being definite compounds, the have relatively stable material properties. Being essentially metallic, they also have relatively large positive linear temperature coefficients (TCL) (for example 2000-4000 ppm/° C.). Poly resistors also may have quite small quadratic temperature coefficients (TCQ) (for example less than 1 ppm/° C.$^2$). These properties make silicides ideal for constructing integrated calibration resistors that are integrated into a poly resistor array (e.g., adjustable resistance network). These same calibration resistors can serve as positive (or negative) segments of the adjustable resistance network.

The trace 505 in FIG. 5 shows the nominal behavior of a particular silicided polysilicon, expressed as a normalized value $R/R_0$, where R is the resistance at some temperature and $R_0$ is the resistance at room temperature, which is assumed to be 25° C. The relationship between the resistance and temperature is an almost linear relationship due to the material having a quadratic temperature coefficient of less than 1 ppm/° C.$^2$. The gray triangles 510 formed by dashed lines represent the limits of process variation. The small size of the triangles 510 illustrates why this resistor can be used as a fairly accurate temperature sensor even if its precise temperature coefficients are not known. The relatively small process variation in nominalized resistance, plus the nearly perfect linearity of the calibration resistor, enable extrapolation of temperature. Thus, it is sufficient to measure the resistance at two temperatures (e.g., 25° C. and 85° C.) to characterize the resistance of the calibration resistor across the range of operating temperatures (e.g., −40° C. to 150° C.).

Figure 6:
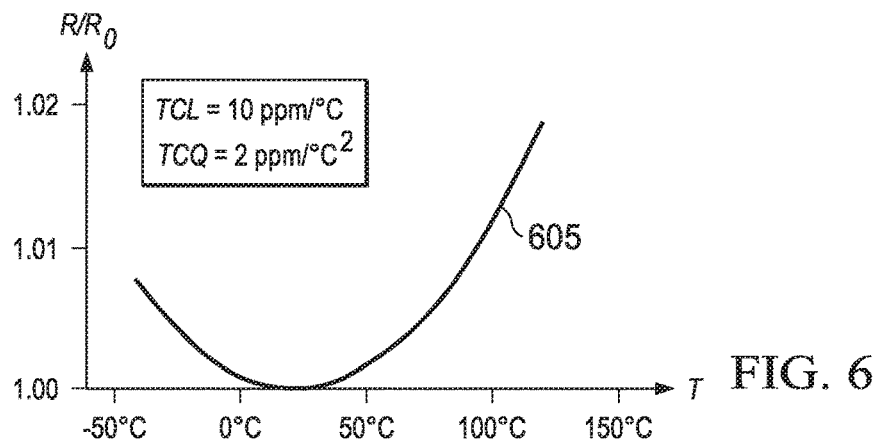
FIG. 6 is a plot of resistance versus temperature of an example silicided polysilicon resistor that illustrates a parabolic or second order relationship between resistance and temperature centered within an operating range of an IC.
Figure 7:
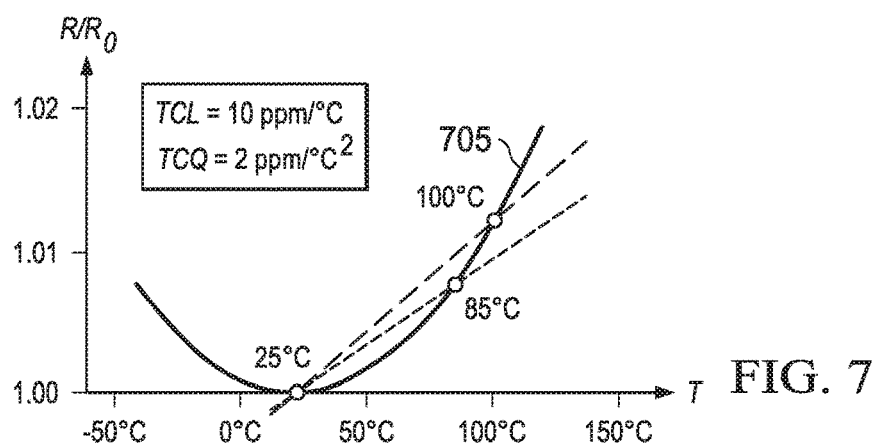
FIG. 7 is a plot of resistance versus temperature of an example silicided polysilicon resistor that illustrates how the second order relationship between resistance and temperature may affect resistance calculations.

However, because doped polysilicon exhibits somewhat greater nonlinearity than silicided poly, and because most of the linear temperature coefficient (TCL) is cancelled by trimming, the quadratic temperature coefficient (TCQ) (also called the parabolic temperature coefficient or the second-order temperature coefficient) forms a significant component of the final trimmed resistance of the resistor device, as illustrated by trace 605 of FIG. 6. Because of the parabolic nature of the TCR of the adjustable resistance network, the trimming process should be performed at the correct temperature. FIG. 7 illustrates a case (as seen in trace 705) in which the adjustable resistance network was trimmed at an actual temperature of 100° C. instead of the intended temperature of 85° C. Extrapolations of normalized resistance based on the two cases are clearly different, as the dotted and dashed lines suggest. This incorrect temperature could be the result of a voltage pulse that was calibrated based on a different packaging arrangement for the same IC being provided to the on-chip resistance heater.

Figure 8:
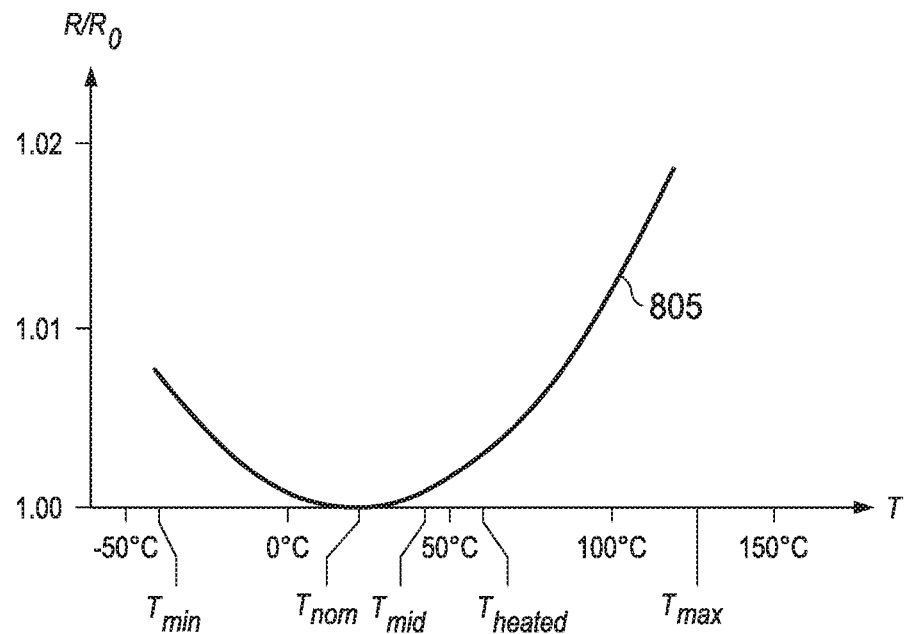
FIG. 8 is a plot of resistance versus temperature of an example silicided polysilicon resistor that illustrate how a temperature coefficient of resistance may be calculated during a trim procedure for an adjustable resistance network, according to one aspect of the description.

One way to calculate the temperature coefficient of the adjustable resistance network relies upon an observation concerning the nature of nonlinear temperature variation. Referring now to FIG. 8, suppose a temperature $T_{mid}$ is defined so $T_{mid}=(T_{min}+T_{max})/2$, where $T_{min}$ and $T_{max}$ are the minimum and maximum operating temperatures, respectively. The function of resistance versus temperature may be expanded into a Taylor series about $T_{mid}$. In most cases it is observed that the cubic and all higher-order terms influence the resistance to a much lesser degree than the quadratic term. Supposing that the linear term is cancelled which leaves only the constant and quadratic terms as significant contributors to resistance, the resistance-versus-temperature function (as seen in trace 805) becomes symmetric about $T_{mid}$. This shifting of the resistance-versus-temperature function is illustrated by trace 905 in FIG. 9. Now if the resistance is measured at room temperature, $T_{nom}$, and also at a temperature $T_{heated}$ which lies as far above $T_{mid}$ as $T_{mid}$ lies above $T_{nom}$ (in equation form, $T_{heated}=2 \cdot T_{mid}-T_{nom}$), then if the linear component is properly cancelled, the resistance at $T_{heated}$ should equal the resistance at $T_{nom}$. If the resistance at $T_{heated}$ is greater than the resistance at $T_{nom}$, then a positive linear temperature coefficient remains; if the resistance at $T_{heated}$ is less than the resistance at $T_{nom}$, then a negative linear temperature coefficient remains. In each case this linear temperature coefficient TCL equals $$TCL = \frac{10^6 \cdot [R(T_{heated}) - R(T_{nom})]}{R(T_{nom}) \cdot [T_{heated} - T_{nom}]} \quad \text{EQ. 1}$$

Figure 9:
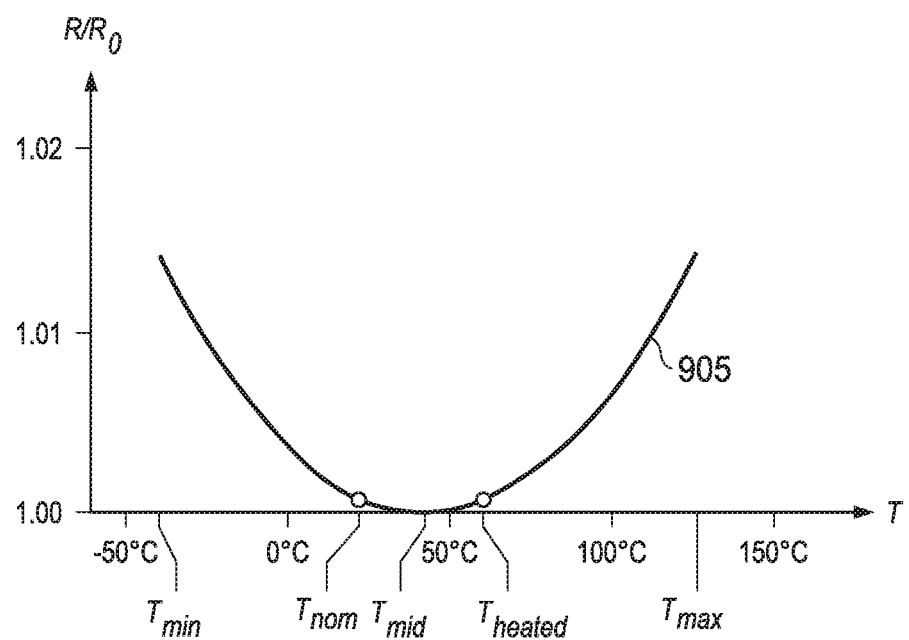
FIG. 9 is a plot of resistance versus temperature of an example silicided polysilicon resistor that illustrate how a temperature coefficient of resistance may be calculated during a trim procedure for an adjustable resistance network, according to one aspect of the description.

If the temperature is measured in degrees Celsius, then TCL has units of ppm/° C. The temperature coefficient trim can be set based on knowledge of the weights of each of the bits and the value of the linear temperature coefficient computed as described above. As an example of this procedure, suppose, as illustrated in FIGS. 8-9, that $T_{min}=-40°$ C. and $T_{max}=125°$ C. Then $T_{mid}=42.5°$ C. If $T_{nom}=25°$ C., then $T_{heated}=60°$ C. If the linear temperature coefficient is properly cancelled, then R(25° C.) should equal R(60° C.). Suppose the actual resistance is measured at these two temperatures and R(25° C.)=101.6 kΩ and R(60° C.)=102.2 kΩ. Then the linear temperature coefficient equals TCL=169 ppm/° C.

Referring again to FIG. 3, to address this potential variation in the thermal response of the adjustable resistance network and a resulting suboptimal trimming process, a strongly temperature-sensitive calibration resistance segments 311 are placed in close proximity to the adjustable resistance network 324 so that the calibration resistance segments 311 are thermally coupled to the adjustable resistance network. As used herein, "thermally coupled" means that the calibration resistance segments 311 are in intimate thermal contact with the adjustable resistance network or is close enough to exhibit a very similar thermal or temperature response as compared to the adjustable resistance network. The segments of the calibration resistor may be distributed throughout the adjustable resistance network as evenly as possible. The calibration resistor and the adjustable resistance network are not used at the same time, so one or more segments of the adjustable resistance network can be connected to selectively serve as the calibration resistor.

For example, the resistance segments 311 of the calibration resistor may be interdigitated with the rest of the segments in the adjustable resistance network. Interdigitated means that the segments of the calibration resistor are in the same integrated circuit layer as the segments of the adjustable resistance network and are interspersed between the segments of the adjustable resistance network.

Interdigitation is a type of common-centroid layout. The centroid of a 2D figure (e.g., an integrated device) equals the geometric average of the locations of all points within it. A simple way to find the centroid is to apply the principle of centroidal symmetry, which says that the centroid of a shape lies on any axis of symmetry passing through it. A rectangle is bisected by vertical and horizontal axes of symmetry and the centroid lies at their intersection. The idea of common centroid layout is that the impact of static spatial temperature gradients upon two matched devices is proportional to the separation between their centroids. Thus, if the centroidal separation between devices is reduced to zero, then the impact of (linear) temperature gradients upon matching is cancelled. For example in an adjustable resistance array, each device might include two separate rectangular regions (e.g., resistance segments) with two of the rectangular regions belonging to resistor A and two to resistor B. If the segments are arranged in the order ABBA, the centroid of the two A segments lies halfway between them (another application of the principle of centroidal symmetry). Likewise the centroid of the two B segments lies halfway between them. The two centroids thus align and the devices are arranged in a common-centroid array. This sort of common-centroid array is said to be interdigitated because the segments slide between one another like the fingers of two interdigitated hands.

In this example, the calibration resistance segments 311 include four RP segments 304 of the adjustable resistance network 324. In other examples, the calibration resistor may be electrically separate from the adjustable resistance network 324, but having segments interdigitated with the adjustable resistance network 324. The calibration resistor may be a selected plurality of the RN or a selected plurality of the RP segments, whichever type (RN or RP) has a relatively large linear temperature coefficient. The relative variation of the selected segments' temperature coefficient over process will be far less than the relative variation of the combined adjustable resistance network because this combined network incorporates both RP and RN segments in an attempt to reduce the adjustable resistance network's overall temperature coefficient. RP and RN are usually interdigitated for matching purposes, providing intimate thermal contact, as well as reducing the impact of lateral thermal gradients generated by other components on the integrated circuit during normal operation.

Returning to FIG. 2, interface circuitry provides one or more electrical connections that allow measurement of the resistance of the calibration resistor. In the illustrated example, the interface circuitry includes bondpad 275 and NMOS transistors 276, 277 to allow for direct resistance measurement of the resistance of the calibration resistor by an external ohmmeter or other resistance measuring device. A conductive pad or bondpad 275 permits connection by wirebonding (or if testing done at a probe, by a probe needle) to the top of resistor R13 (which is the calibration resistor comprising segments 311 of FIG. 3). The NMOS transistors 276, 277, when activated, electrically isolate the calibration resistor from the adjustable resistance network to allow the resistance of the calibration resistor to be measured.

NMOS transistor 276, also referred to as a calibration switch, grounds the low side of resistor R13 when a calibration measurement is to be made. The calibration measurement process is triggered by a calibration signal comprising a constant voltage representing a logic high or one being applied to a calibration trigger input C at the gate of NMOS transistor 276. In an alternative example, a logic low or zero may be used with a different type of switch for measurement of the calibration resistor. In response to a deactivation signal (which in the example of FIG. 2 is also the calibration signal C), NMOS transistor 277, also referred to as a current source deactivation switch, forces amplifier 202 to disable NMOS transistor 203 and thus prevents current flowing from IBIAS to bondpad 275 during calibration. In this manner the only current flowing from IBIAS to bondpad 275 during calibration is that from bondpad 275 to ground (through calibration resistor R13).

The calibration resistance of the calibration resistor measured using the interface circuitry will serve as a proxy that represents the temperature of the calibration resistor and, due to the close thermal proximity, the adjustable resistance network. In this manner, by measuring the calibration resistance it can be confirmed that the adjustable resistance network is being heated to the desired temperature during trimming.

An example heater calibration system 270 includes a processor 272 and an ohmmeter 271 (or other circuit that measure resistance) that can be connected to bondpad 275. In one example, the heater calibration system 270 is implemented in circuitry external to the IC. In another example, the heater calibration system 270 is implemented in circuitry disposed in the IC. During the calibration process, the processor 272 generates a power supply (PS) control signal that controls an external power supply to provide a predetermined power pulse (PP) to the input V3 for the heater during the trimming of the adjustable resistance network 224. The processor 272 also generates the logic high or one value for the calibration trigger C. The ohmmeter 271 measures the calibration resistance of the calibration resistor R13 by way of bondpad 275. The processor 272 compares a calibration value stored in NVM 287 (e.g., a calibration resistance or "expected"/calibration temperature rise) with a value the processor 272 derives from the measured calibration resistance. The NVM 287 is illustrated as being included in trim controller 260, however, the NVM 287 may be disposed elsewhere on the IC. The calibration value may be stored in an NVM that stores other values, such as NVM 261 or NVM 262.

The ohmmeter 271 may or may not be external to the IC, while other components, such as the NVM 287 are included in the IC. In another example, rather than an external ohmmeter, an analog-to-digital converter on the IC could be used to measure the calibration resistance by converting the voltage measured across the calibration resistor when a given current was injected into it, and sending out the digital result. In effect, the ADC and the current source would function as an on-chip ohmmeter. In this example, the interface circuitry may not include NMOS transistors 276, 277 or bondpad 275 but rather would include appropriate connection features for connecting the calibration resistor to the ADC and current source.

The heater calibration system 270 generates a temperature result which may be indicative of an estimated amount of heating of the adjustable resistance network based on the measured calibration resistance. This result may be a yes/no indication as to whether the adjustable resistance network was heated to within a tolerance of a desired temperature (i.e., the measured resistance matches the calibration resistance value). The result may be used to trigger a re-calibration of the power pulse PP provided to the heater element 225.

Figure 10:
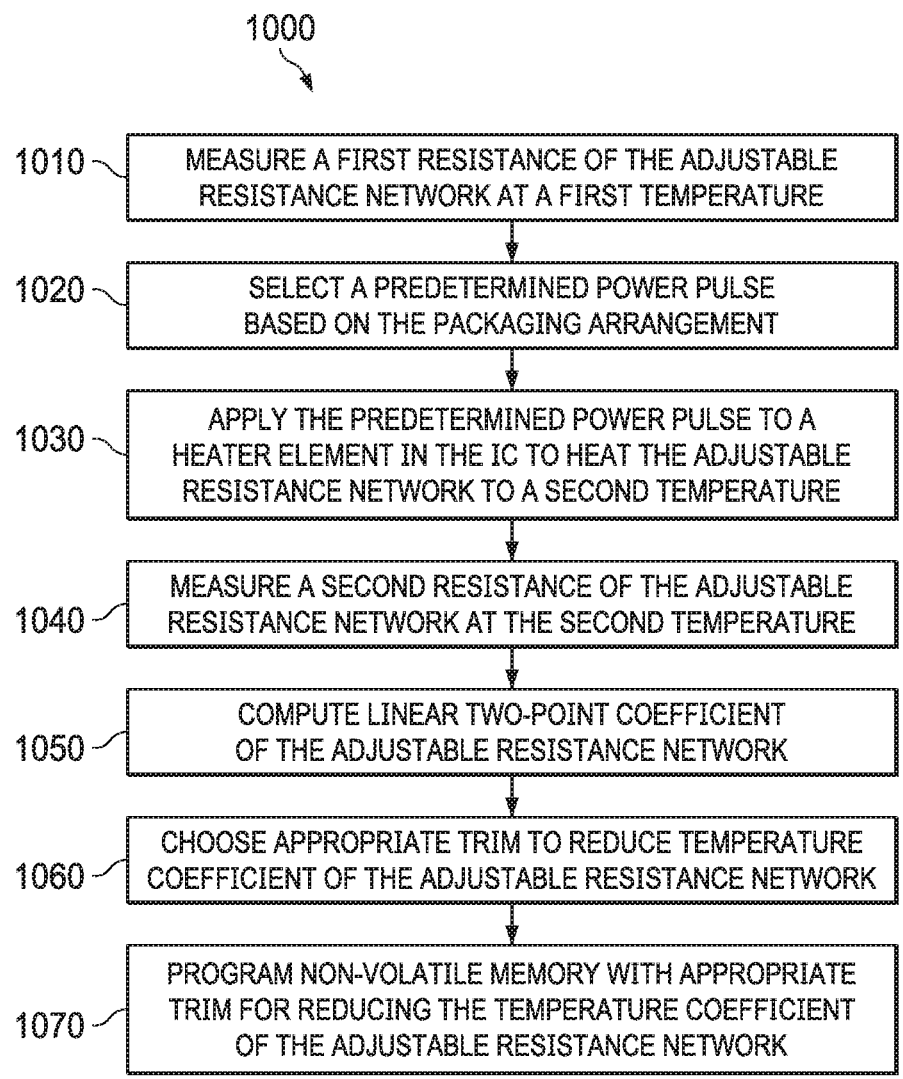
FIG. 10 is a flow diagram outlining an example method for trimming an adjustable resistance network, according to one aspect of the description.

FIG. 10 is a flow diagram outlining an example method 1000 for calibrating the temperature coefficient of an adjustable resistance network in an integrated circuit (IC) installed in a packaging arrangement. The method 1000 may be performed, for example, by trim controller 260 of FIG. 2. The method includes, at 1010, measuring first resistance of the adjustable resistance network at a first temperature. The first temperature will often be room temperature or about 25° C., but it could be another temperature imposed on the chip by a temperature forcing system. Note that this resistance measurement is of the overall adjustable resistance network as described above for the trimming process and not the calibration resistor. The resistance can be measured by applying predetermined values to TC0-3 and IREF0-3 in FIG. 2 and measuring the bias current IBIAS, or by any other technique that can measure the total resistance of the adjustable resistance network 224.

At 1020, a predetermined power pulse is selected based on the packaging arrangement. The predetermined power pulse has a predetermined magnitude of power for a predetermined amount of time. The appropriate power and duration of the power pulse can be estimated by characterizing integrated circuits built in a particular packaging arrangement. First these devices are placed in an oven or thermal forcing system and the calibration resistor is measured at various known temperatures. Next the devices are brought to the first temperature referenced in step 1010, and a power pulse is applied, after which the calibration resistance is immediately measured (e.g., within a few microseconds). The comparison of this resistance to previously measured resistances of the calibration resistor at various temperatures allows estimation of the temperature. This process may be repeated with different power pulses to determine an amount of power and time of applying power to be used as the predetermined power pulse to achieve a desired second temperature, for example 85° C. The predetermined power pulse is thus selected to produce a calibrated temperature rise (e.g., 60° C.) in the devices under test.

At 1030, the predetermined power pulse is applied to the heater element in the IC to heat the adjustable resistance network to the second temperature. At 1040, the resistance of the resistance network is (again) measured with the same predetermined values of TC0-3 and IREF0-3 as were applied at 1010. At 1050, the linear two-point temperature coefficient of the adjustable resistance network is computed. In one example, the linear two-point temperature coefficient is computed by taking the difference between the second resistance and the first resistance, dividing by the first resistance to normalize the result, dividing by one million to transform the result into parts per million (ppm), and dividing by the "expected"/calibration temperature rise, as computed at 1020. At 1060, an appropriate trim is chosen to reduce the temperature coefficient of the adjustable resistance network. This may be performed by choosing an appropriate value of TC0-3 based on the temperature coefficient computed at 1050, and knowledge of the impact of each trim bit TC0-3 upon the temperature coefficient of the adjustable resistance network, as derived from simulation or characterization. The impact of both the linear and quadratic components of the temperature coefficient of the adjustable resistance network should be considered and the trim configuration that reduces the resistance deviation over the entire temperature range should be chosen. At 1070, the NVM is programmed with the appropriate trim for reducing the temperature coefficient of the adjustable resistance network (e.g., the chosen values of TC0-3 are programmed into NVM 261 (see FIG. 2)).

Figure 11:
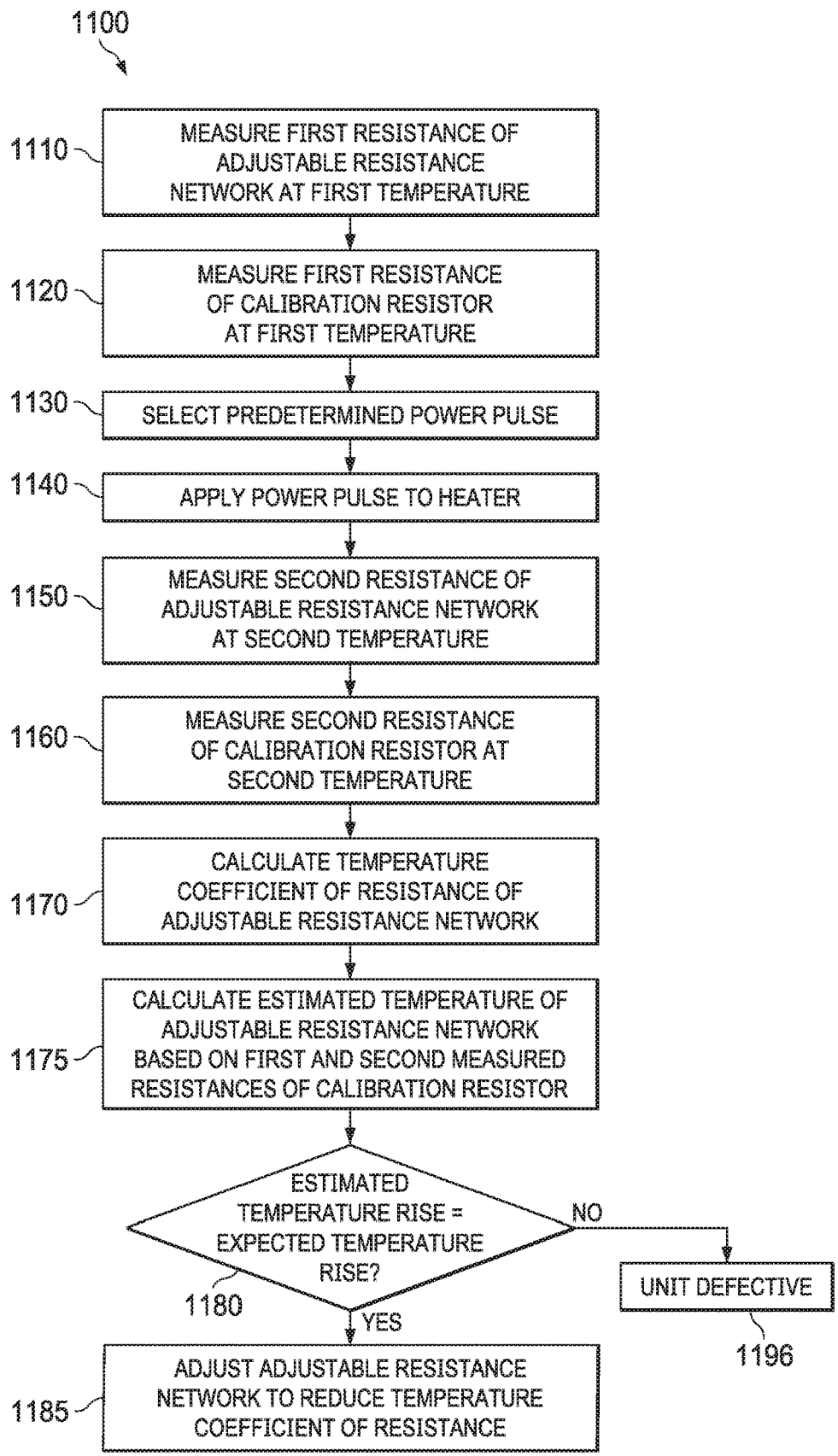
FIG. 11 is a flow diagram outlining an example method for confirming that a desired heating level was obtained during trimming, according to one aspect of the description.

One benefit of the integrated calibration resistor is that it can be used to confirm that the packaging configuration of the integrated circuit under test corresponds to the packaging configuration initially used during the determination of the predetermined power pulse for the heater. FIG. 11 is a flow diagram outlining an example method 1100 for setting the temperature coefficient of the adjustable resistance network that includes this packaging confirmation. The method 1100 may be performed, for example, by processor 272 of the heater calibration system 270 of FIG. 2. At 1110, a first resistance of the adjustable resistance network is measured at a first temperature (e.g., room temperature). At 1120, a first resistance of the calibration resistor is measured at the first temperature. At 1130, a predetermined power pulse is selected (e.g., based on the packaging configuration used during initial characterization). At 1140, the power pulse is applied to the heater. At 1150, a second resistance of the adjustable resistance network at the second (elevated) temperature is measured. At 1160, a second resistance of the calibration resistor is measured at the (same) second temperature. At 1170, the temperature coefficient of resistance of the adjustable resistance network is calculated.

At 1175, the calculated (elevated) temperature of the adjustable resistance network is calculated based on the first and second measured resistances of the calibration resistor. In one example, the "estimated"/calculated temperature is calculated by dividing the second measured resistance of the calibration resistor by the first measured resistance to determine a value of R/R0, and indexing this value against the trace 505 of FIG. 5 representing nominal behavior of the calibration resistor to determine the second temperature. For example, if the trace 505 represents the calibration resistor used, and the second measured calibration resistance is 1.2 times the first, then the second temperature would be 100° C. and the "estimated"/calculated temperature rise caused by activating the heater with the predetermined power pulse would be 75° C. At 1180, a determination is made as to whether the "estimated"/calculated temperature rise is equivalent to (e.g., within an acceptable range of) the "expected"/calibration temperature rise (e.g., 60° C. as determined during characterization at 1020 in method 1000). The "estimated"/calculated temperature rise is used instead of an absolute calculated temperature to reduce the impact of variations in the first temperature, as room temperatures may vary slightly. If the "estimated"/calculated temperature rise matches the "expected"/calibration temperature rise within a reasonable margin of error (e.g., +/−20%), the method proceeds to 1185 and the adjustable resistance network is adjusted to reduce its temperature coefficient. If the "estimated"/calculated temperature rise does not fall within the range of expectation, at 1196 the unit is binned out ad being defective and testing of the unit is terminated. Should a large number of units bin out in this manner, the test engineers may decide to determine a new amount of power and/or time to apply the power for a new power pulse to be used in testing units.

Figure 12:
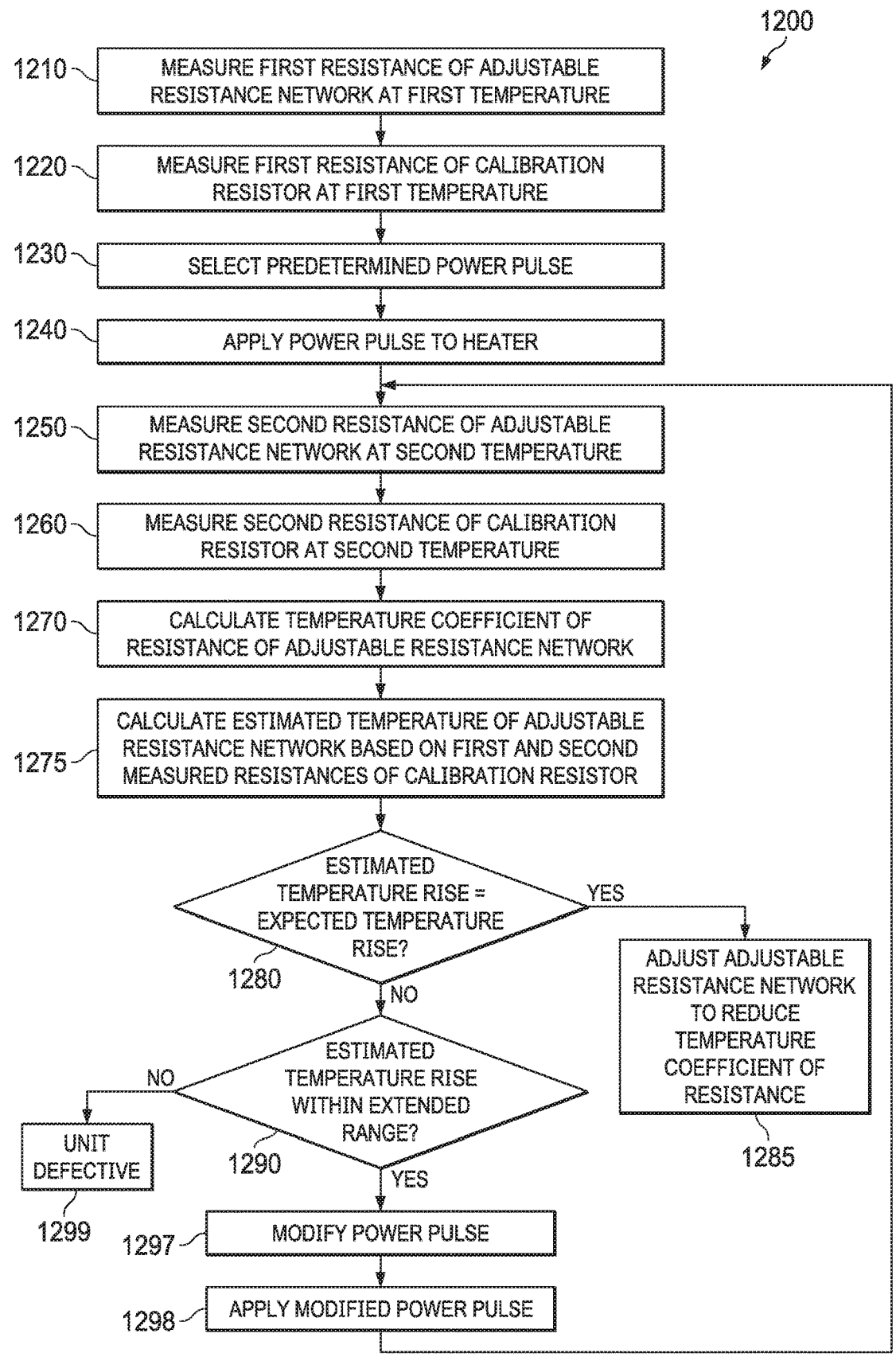
FIG. 12 is a flow diagram outlining an example method for calibrating a power pulse applied to a heater, according to one aspect of the description.

FIG. 12 is a flow diagram outlining an example method 1200 for automatically adjusting the power pulse that is applied to the heater element during the trimming process. The method 1200 may be performed, for example, by the processor 272 of the heater calibration system 270 of FIG. 2. The method 1200 might not involve operator intervention or rewriting of the test program to adjust power pulse, as the same testing method can be used for all packaging configurations of ICs that include the adjustable resistance network. Furthermore, using method 1200 means that a constant power might not be applied to the heater, but rather only a constant voltage, as the method 1200 automatically corrects for variations in heater metallization resistance.

At 1210, a first resistance of the adjustable resistance network is measured at a first temperature (e.g., room temperature). At 1220, a first resistance of the calibration resistor is measured at the first temperature. At 1230, a predetermined power pulse is selected (e.g., based on the packaging configuration used during initial characterization). At 1240, the power pulse is applied to the heater. At 1250, a second resistance of the adjustable resistance network at the second (elevated) temperature is measured. At 1260, a second resistance of the calibration resistor is measured at the (same) second temperature. At 1270, the temperature coefficient of resistance of the adjustable resistance network is calculated.

At 1275, a calculated (elevated) temperature of the adjustable resistance network is calculated based on the first and second measured resistances of the calibration resistor. In one example, the "estimated"/calculated temperature is calculated by dividing the second measured resistance of the calibration resistor by the first measured resistance to determine a value of R/R0, and indexing this value against the trace 505 of FIG. 5 representing nominal behavior of the calibration resistor to determine the second temperature. For example, if trace 505 represents the calibration resistor used, and the second measured calibration resistance is 1.2 times the first, then the "estimated"/calculated temperature would be 100° C. and the "estimated"/calculated temperature rise caused by activating the heater with the predetermined power pulse would be 75° C. At 1280, a determination is made as to whether the "estimated"/calculated temperature rise is equivalent to (e.g., within an acceptable range of) the value of the "expected"/calibration temperature rise (e.g., 60° C. as determined during characterization at 1020 in method 1000). The "estimated"/calculated temperature rise is used instead of an absolute calculated temperature to reduce the impact of variations in the first temperature, as room temperatures may vary slightly. If the "estimated"/calculated temperature rise matches the "expected"/calibration temperature rise within a reasonable margin of error (e.g., +/−10%), the method proceeds to 1285 and the adjustable resistance network is adjusted to reduce its temperature coefficient.

If the "estimated"/calculated temperature rise does not fall within the range of expectation, at 1290 it is determined whether the "estimated"/calculated temperature rise lies within some extended range of the "expected"/calibration temperature rise. If so, at 1297 a modified power pulse is determined for use in for testing subsequent units. The present power pulse may be modified based on the "estimated"/calculated temperature rise and parameters describing the modified pulse are saved for testing of further units. At 1298, after cooling, the modified pulse is applied to the unit to complete the trim operation. If, at 1280, the "estimated"/calculated temperature rise does not fall within the range of expectation, and is also outside the extended range of the "expected"/calibration temperature rise, at 1299 the unit is binned out as presumed defective.

There are several ways to modify the predetermined power pulse based on the "estimated"/calculated temperature rise (e.g., at 1297). In one example, a modified value of the voltage to be applied (while keeping the application time constant) is computed by multiplying the voltage of the predetermined power pulse by the "expected"/calibration temperature rise and dividing by the "estimated"/calculated temperature rise. In another example, the modified value of the predetermined pulse's voltage $V_{mod}$ is computed from the previously used voltage $V_{old}$, the "expected"/calibration temperature rise $\Delta T_{exp}$ and the "estimated"/calculated temperature rise $\Delta T_{est}$, using the equation $$V_{mod} = V_{old}(1+k^*(\Delta T_{exp}/\Delta T_{est}-1)) \quad \text{EQ. 2}$$

where damping constant k is a constant greater than zero and less than one (e.g., 0.1). The use of the constant k provides damping so that if a single measurement lies far from the desired value due to a defect in the device under test, it will not overly impact the measurement of subsequent units.

In another example, a new time period during which the existing voltage is applied is computed to determine the modified power pulse. This approach allows the use of a constant voltage source for driving the heater, which may be advantageous when, for example, multiple units are tested in parallel.

Figure 13:
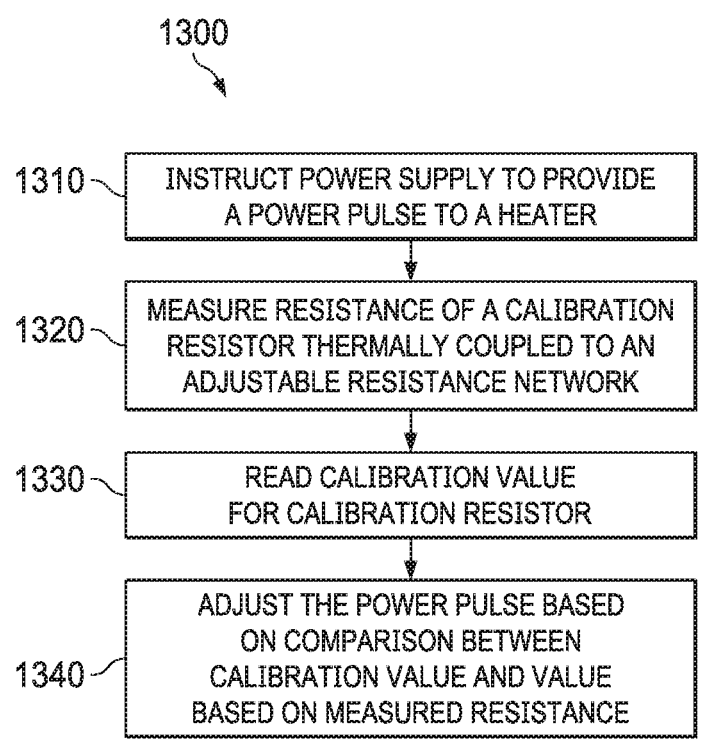
FIG. 13 is a flow diagram outlining an example method for calibrating a power pulse applied to a heater, according to one aspect of the description.

FIG. 13 is a flow diagram outlining an example method 1300 for calibrating a heater that, in response to a power pulse having a predetermined voltage level and duration, heats an adjustable resistance network during a trimming procedure. The method 1300 may be performed by the processor 272 of FIG. 2. The method includes, at 1310, instructing a power supply to provide a power pulse to a heater. The method includes, at 1320, measuring a resistance of a calibration resistor thermally coupled to an adjustable resistance network. The method includes, at 1330, reading a calibration value for the calibration resistor. The method includes, at 1340, adjusting the predetermined voltage level or duration of the power pulse based on a comparison between the calibration value and a value based on the measured resistance.

As described above, providing a calibration resistor to more directly determine a temperature of an adjustable resistance network during trimming may improve the quality of the trimming result.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

Modifications are possible in the described examples, and other implementations are possible, within the scope of the claims.

What is claimed is:

1. A circuit, comprising:
   an adjustable resistance network that includes first resistance segments;
   a heater element thermally coupled to the adjustable resistance network;
   an amplifier having first and second amplifier inputs and an amplifier output, the first amplifier input coupled to a first terminal of the adjustable resistance network;
   a calibration resistor comprising second resistance segments thermally coupled to the first resistance segments, and electrically coupled to the second amplifier input;
   a first transistor coupled between a bias current terminal and the adjustable resistance network, and having a first control terminal coupled to the amplifier output;
   a connection terminal coupled to a second terminal of the adjustable resistance network,
   a second transistor coupled between the second amplifier input and a ground terminal, and having a second control terminal; and
   a third transistor coupled between a third terminal of the adjustable resistance network and the ground terminal, and having a third control terminal coupled to the second control terminal.

2. The circuit of claim 1, wherein the first resistance segments are disposed in a layer of an integrated circuit and the second resistance segments are also disposed in the layer.

3. The circuit of claim 1, wherein the first resistance segments are disposed in first layers of an integrated circuit and the second resistance segments are disposed in second layers of the integrated circuit, wherein the first layers are adjacent or proximate the second layers.

4. The circuit of claim 1, wherein the first resistance segments are members of an array of physical resistance segments fabricated from a resistive material and the second resistance segments are members of the array of physical resistance segments.

5. The circuit of claim 1, wherein the second resistance segments are interdigitated with the first resistance segments.

6. The circuit of claim 1, wherein the second resistance segments belong to the first resistance segments.

7. The circuit of claim 1, wherein the second resistance segments do not belong to the first resistance segments.

8. The circuit of claim 1, wherein the interface circuitry comprises a conductive pad coupled to the calibration resistor.

9. The circuit of claim 1, wherein the second transistor and third transistor are configured to electrically isolate the calibration resistor from the adjustable resistance network.

* * * * *